(12) United States Patent
Dhanasekaran et al.

(10) Patent No.: US 7,259,627 B1
(45) Date of Patent: Aug. 21, 2007

(54) TRUE DIFFERENTIAL MICROPHONE AMPLIFIER

(75) Inventors: Vijayakumar Dhanasekaran, Bryan, TX (US); Douglas L. Youngblood, Palm Bay, FL (US)

(73) Assignee: Intersil Americas, Inc., Milpitas, CA (US)

( * ) Notice: Subject to any disclaimer, the term of this patent is extended or adjusted under 35 U.S.C. 154(b) by 175 days.

(21) Appl. No.: 11/231,092

(22) Filed: Sep. 20, 2005

Related U.S. Application Data

(60) Provisional application No. 60/614,637, filed on Sep. 30, 2004.

(51) Int. Cl.
*H03F 3/45* (2006.01)
(52) U.S. Cl. .................................. 330/259; 381/122
(58) Field of Classification Search ................ 330/259; 381/121, 122
See application file for complete search history.

(56) References Cited

U.S. PATENT DOCUMENTS

| 4,374,363 A | 2/1983 | Previti |
| 5,329,620 A | 7/1994 | Alford et al. |
| 6,433,608 B1 * | 8/2002 | Huang ........................ 327/307 |

OTHER PUBLICATIONS

Germano Nicollini and Carlo Guardiani, *a 3.3-V 800-nV rms Noise, Gain-Programmable CMOS Microphone Preamplifier Design Using Yield Modeling Technique*, IEEE Journal of Solid-State Circuits, vol. 28, No. 8, Aug. 1993. pp. 915-921.
Michael W. Baker and Rahul Sarpeshkar, *A Low-Power High-PSRR Current-Mode Microphone Preamplifier*, IEEE Journal of Solid-State Circuits, vol. 38, No. 10, Oct. 2003, pp. 1671-1678.

* cited by examiner

*Primary Examiner*—Robert Pascal
*Assistant Examiner*—Alan Wong
(74) *Attorney, Agent, or Firm*—Gary R. Stanford

(57) ABSTRACT

A differential amplifier circuit which amplifies a signal developed by a signal generating device when coupled between first and second input nodes and provides an amplified differential signal at first and second output nodes. First and second current sources source first and second current levels to the first input node and the first output node, respectively. First and second current sinks sink the first and second current levels from the second input node and the second output node, respectively. A first current amplifier controls current between the first output node and the second input node to maintain the second input node at a first bias voltage level. A second current amplifier controls current between the first input node and the second output node to maintain the first input node at a second bias voltage level. An optional feedback circuit senses a DC offset and adjusts current to compensate.

20 Claims, 1 Drawing Sheet

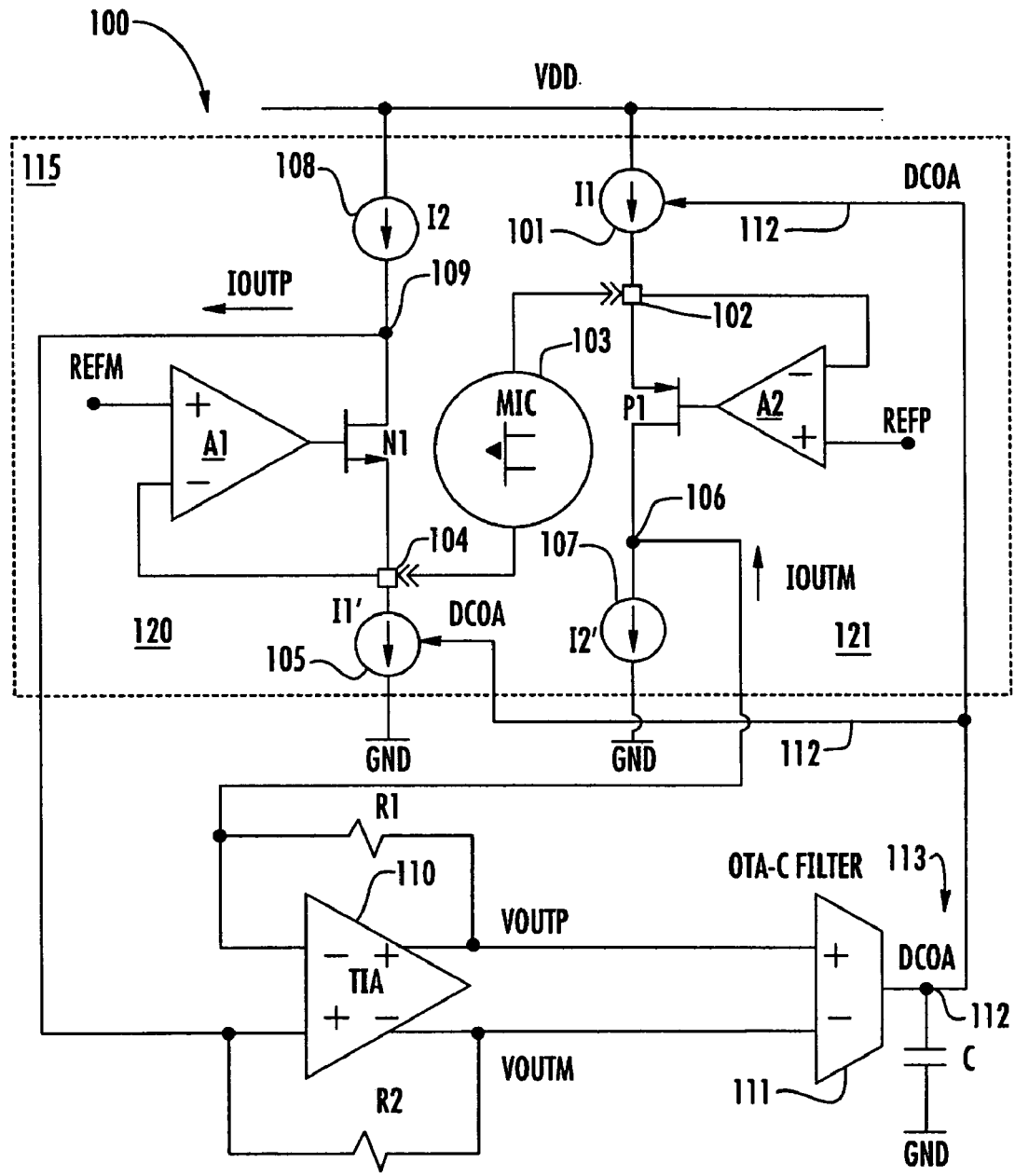

TRUE DIFFERENTIAL MICROPHONE AMPLIFIER

CROSS-REFERENCE TO RELATED APPLICATIONS

This application claims the benefit of U.S. Provisional Application No. 60/614,637 filed on Sep. 30, 2004, which is herein incorporated by reference for all intents and purposes.

BACKGROUND OF THE INVENTION

1. Field of the Invention

The present invention relates to audio circuits and amplifiers, and more particularly to a true differential microphone amplifier that amplifies weak signals from a microphone while rejecting common mode noise.

2. Description of the Related Art

Many handheld and portable consumer electronic devices, such as cell phones, personal digital assistants (PDAs), digital cameras, laptop computers, etc., use a microphone. A common microphone configuration for such electronic devices comprises an electret condenser having a diaphragm which performs sound to voltage conversion. The electret condenser is coupled to the gate of a junction field-effect transistor (JFET) device used as a buffer inside the microphone. The gate of the JFET detects audio signals converted by the electret condenser and the drain and source of the JFET are used as the two-wire interface to an amplifier or preamplifier to amplify the audio signal provided as a current signal. Although the present invention is illustrated for an electret condenser type microphone, other types of signal generating devices are contemplated.

Some amplifier solutions are single-ended in which one terminal of the two-wire interface of the microphone is coupled to ground. Other solutions that do not ground a microphone pin often include a "microphone bias" pin, which increases the pin count on the preamplifier integrated circuit (IC) or chip. Most solutions require external support devices, such as bias resistors and/or coupling capacitors. Differential voltage solutions are known but suffer from distortion problems. Current mode solutions are known but are usually single-ended.

It is desired to provide a cost effective amplifier circuit for the microphone which meets noise, distortion and power supply rejection (PSR) specifications for electronic devices. It is desired to provide a solution that amplifies weak signals from the microphone while rejecting the common mode noise. It is desired to provide a differential solution that connects directly to the two interface terminals of the JFET microphone without the need for external components.

SUMMARY OF THE PRESENT INVENTION

A differential amplifier circuit according to an embodiment of the present invention amplifies a signal developed by a signal generating device when coupled between first and second input nodes and provides an amplified differential signal at first and second output nodes. The differential amplifier circuit includes first and second current sources, first and second current sinks and first and second current amplifiers. The first and second current sources source first and second current levels to the first input node and to the first output node, respectively. The first and second current sinks sink the first and second current levels from the second input node and the second output node, respectively. The first current amplifier controls current between the first output node and the second input node to maintain the second input node at a first bias voltage level. The second current amplifier controls current between the first input node and the second output node to maintain the first input node at a second bias voltage level.

The current sources, sinks, and amplifiers collectively operate to establish a predetermined bias current through, and a predetermined bias voltage across, the signal generating device when coupled between the first and second input nodes. The signal generating device may be implemented as electret condenser coupled to the gate of a junction field-effect transistor (JFET), although other types of signal generating devices are contemplated.

The second current source, the first current sink and the first current amplifier may collectively be implemented an N-channel metal-oxide semiconductor (NMOS) common gate amplifier. Likewise, the first current source, the second current sink and the second current amplifier may collectively be implemented as a P-channel MOS (PMOS) common gate amplifier. In a more specific embodiment, the current amplifiers both include a transconductance amplifier and a MOS transistor. The drain and source of each MOS transistor is coupled between a corresponding current source and current sink. The non-inverting input of each transconductance amplifier receives a corresponding bias voltage level and the inverting input is coupled to a corresponding current device that is coupled to a terminal of the signal generating device. The output of the amplifier is coupled to the gate of the transistor.

A negative feedback loop circuit may be included. The negative feedback loop circuit has a differential input coupled to the second current source and the second current sink and an output providing an adjust signal indicative of DC offset of the amplified differential signal. The first current source and the first current sink each have an adjust input coupled to the output of the negative feedback loop circuit. In a more specific embodiment, a differential transimpedance amplifier is included, which has a differential input coupled to the second current source and the second current sink and a differential voltage output. And further, an operational transconductance amplifier (OTA) may be included which has a differential input coupled to the differential voltage output of the differential trans-impedance amplifier. The output of the OTA is coupled to a capacitive device and to an adjust input of the first current source and the first current sink. The OTA and capacitor form a filter circuit for sensing a DC offset and reducing or eliminating the DC offset by adjusting the first current level.

The differential amplifier circuit amplifies weak signals from the signal generating device, such as a microphone or the like, while rejecting common mode noise. The two terminals of the signal generating device are coupled directly to the input of the amplifier, which eliminates external components such as bias resistors or coupling capacitors and the like, and which eliminates the need for a bias pin thereby reducing pin count. The current devices and amplifiers form a current buffer which biases the signal generating device while also extracting the signal current. The signal generating device is therefore used as a differential current source and neither terminal is grounded. The feedback loop is a filter circuit or the like which senses a DC offset in the output and reduces or eliminates the DC offset by adjusting the first current level.

A differential microphone amplifier according to an embodiment of the present invention includes four current sources and first and second current amplifiers. The first current source is coupled between a voltage source and a positive microphone node and provides a first current level. The second current source is coupled between a negative microphone node and ground and also provides the first current level. The third current source is coupled between the voltage source and a positive current output node and provides a second current level. The fourth current source is coupled between a negative current output node and ground and also provides the second current level. The first current amplifier circuit is coupled between the positive microphone node and the negative current output node. The first current amplifier circuit maintains the positive microphone node at a first bias voltage and develops a first polarity amplified microphone signal at the positive current output node. The second amplifier circuit is coupled between the positive current output node and the negative microphone node. The second amplifier circuit maintains the negative microphone node at a second bias voltage and develops a second polarity amplified microphone signal at the negative current output node. The first and second bias voltages provide a microphone bias voltage and the first and second current levels provide a microphone bias current.

A differential trans-impedance amplifier circuit may be included which has differential inputs coupled to the positive and negative current output nodes and an output providing a corresponding differential output voltage signal. In a feedback embodiment, the first and second current sources each have an adjust input. An OTA filter may be included which has a differential input coupled to receive the differential output voltage signal and an output coupled to a capacitor and the adjust inputs of the first and second current sources.

A method of amplifying signals from a microphone while rejecting common mode noise according to an embodiment of the present invention includes sourcing a first current into a first microphone node, sourcing a second current into a first output node, pulling the first current from a second microphone node, pulling the second current from a second output node, controlling a first current between the first microphone node and the second output node while maintaining voltage at the first microphone node at a first bias voltage level, controlling a second current between the second microphone node and the first output node while maintaining voltage at the second microphone node at a second bias voltage level, and detecting a differential amplified output current at the first and second output nodes.

The method may include detecting, by a high gain amplifier, the first bias voltage level, and controlling, by the high gain amplifier, a current device coupled between the first microphone node and the second output node in an attempt to maintain the voltage at the first microphone node at the first bias voltage level. The method may also include detecting, by another high gain amplifier, the second bias voltage level, and controlling, by the other high gain amplifier, a current device coupled between the second microphone node and the first output node in an attempt to maintain the voltage at the second microphone node at the second bias voltage level.

The method may include sensing a DC offset of the differential amplified output current and adjusting the first current sourced into a first microphone node and the first current pulled from the second microphone node. The method may include converting the differential amplified output current into a differential voltage. The method may further include converting the differential voltage into an adjust current, charging a capacitor with the adjust current to develop an adjust voltage, and adjusting the first current sourced into a first microphone node and the first current that is drawn from the second microphone node based on the adjust voltage.

BRIEF DESCRIPTION OF THE DRAWINGS

The benefits, features, and advantages of the present invention will become better understood with regard to the following description, and accompanying drawings where:

The sole FIGURE is a schematic diagram of a true differential microphone preamplifier according to an exemplary embodiment of the present invention coupled to a microphone.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventors have recognized the need to provide a cost effective amplifier solution for a microphone that meets or otherwise exceeds specifications. They have therefore developed a true microphone differential preamplifier that couples directly to the microphone without external components, that eliminates the microphone bias pin, and that employs a current buffer that operates to bias the microphone while also extracting the signal current from the microphone.

The sole FIGURE is a schematic diagram of a true differential microphone preamplifier 100 implemented according to an exemplary embodiment of the present invention and coupled to a microphone (MIC) 103. A supply voltage VDD is provided to inputs of current sources 101 and 108 generating currents I1 and I2, respectively. The output of current source 101 is coupled to a first microphone node 102, which is further coupled to an inverting input of a transconductance (gm) boost amplifier A2, to the source of a P-channel metal-oxide semiconductor (PMOS) transistor P1 and to a first terminal of the microphone 103. The current source 101 may be adjustable and sources the I1 current from VDD to node 102. The illustrated microphone 103 includes a two-terminal (source, drain) interface junction field-effect transistor (JFET) having a gate coupled to an electret condenser, although other types of microphone devices or signal generating devices are contemplated. The other terminal of the microphone 103 is coupled to another microphone node 104, which is coupled to an inverting input of another gm boost amplifier A1, to the input of a current source 105 generating a current I1', and to the source of an N-channel MOS (NMOS) transistor N1. The current source 105 may be adjustable and has its output coupled to ground (GND) and sinks or pulls the I1' current from node 104 to GND. The output of the current source 108 is coupled to a node 109 which is coupled to the drain of N1, and the current source 108 sources the I2 current from VDD to node 109. The non-inverting input of the amplifier A1 receives a negative microphone bias voltage REFM, and the output of the amplifier A1 is coupled to the gate of N1. The non-inverting input of the amplifier A2 receives a positive microphone bias voltage REFP, and the output of the amplifier A2 is coupled to the gate of P1. The drain of P1 is coupled to a node 106, which is coupled to the input of another current source 107 developing a current I2'. The current source 107 has its output coupled to GND and sinks or pulls the I2' current from node 107 to GND.

The node 109 is coupled to a non-inverting input of a differential trans-impedance amplifier (TIA) 110, and to one end of a resistor R2. The node 106 is coupled to an inverting input of the differential TIA 110, and to one end of another resistor R1. The other end of the resistor R1 is coupled to a positive voltage output of the differential TIA 110 developing a signal VOUTP. The other end of the resistor R2 is coupled to a negative voltage output of the differential TIA 110 developing a signal VOUTM. The pair of signals VOUTP/VOUTM collectively form a differential output voltage signal representative of the current signal generated by the microphone 103, as further described below. The VOUTP/VOUTM differential output voltage signal is provided to respective non-inverting and inverting differential inputs of an operational transconductance amplifier (OTA) 111, which has an output coupled to a node 112 which is coupled to one end of a capacitor C and to an adjust input of each of the current sources 101 and 105. The other end of the capacitor C is coupled to ground. The OTA 111 and the capacitor C collectively form an OTA-C filter 113, which develops a DC offset adjust (DCOA) voltage on node 112 used to adjust the currents I1 and I1'.

The amplifier A1 and the transistor N1 collectively form a first current amplifier and the amplifier A2 and the transistor P1 collectively form a second current amplifier. The current sources 105, 108, the amplifier A1 and the transistor N1 collectively form an NMOS common gate (CG) amplifier 120 and the current sources 101, 107, the amplifier A2 and the transistor P1 collectively form a PMOS CG amplifier 121. The NMOS and PMOS CG amplifiers 120, 121 collectively form a current buffer 115 which enables operating the microphone 103 in a true differential current mode. The current buffer 115 provides the DC bias current to, and extracts the signal current from, the microphone 103. The PMOS CG amplifier sets the positive bias voltage REFP for the microphone 103 at node 102 and the NMOS CG amplifier sets the negative bias voltage REFM for the microphone 103 at node 104. The current sources 101 and 105 provide total current level for the DC bias current for the microphone 103 and for the PMOS and NMOS CG amplifiers of the current buffer 115. The current sources 108 and 107 provide a difference current which establishes the appropriate bias current level for both the PMOS and NMOS CG amplifiers of the current buffer 115. The adjustability of the current sources 101 and 105 together with the OTA-C filter 113 collectively form an optional DC offset negative feedback correction loop which minimizes DC voltage offset of the overall amplifier 100 and biases the microphone 103 appropriately. It is noted that the specific polarities of the terminals of the TIA 110 and the OTA 111 and the specific configurations of adjustable connections of the current sources 101 and 105 are arbitrary in the feedback loop as long as negative feedback is achieved to minimize DC offset. The gm boosting amplifiers A1 and A2 are useful in setting the lead voltages of the microphone 103 and also assist in reducing any non-linearity of the current buffer 115. The exemplary TIA 110 illustrated comprises a typical differential-in, differential-out amplifier with feedback resistors R1 and R2.

In one embodiment employing the JFET type microphone 103, the voltage level of VDD can range between 2.5 V and 5.5 V. The bias voltage between nodes 102 and 104 (e.g., REFP−REFM) is approximately 1.6 Volts (V) and the bias current through the microphone 103 is approximately 200 microamperes (µA). As an example, REFM is 0.4 V and REFP is 2 V, the current sources 101 and 105 are each set to approximately 250 µA and the current sources 108 and 107 are each set to approximately 50 µA so that the bias voltage across the microphone 103 is 1.6 V and the bias current flowing through the microphone 103 is approximately 200 µA. In the steady state condition with no signal current through the microphone 103 and assuming negligible current at the inputs of the amplifiers A1 and A2, the 250 µA from the current source 101 splits at node 102 into 200 µA bias current through the microphone 103 and 50 µA through the source-drain path of P1 and the current source 107. The 200 µA of current from the microphone 103 and the 50 µA from the current source 108 combine at node 104 to satisfy the 250 µA current of the current source 105.

In operation, by virtue of the structure of the current buffer 115, the signal current generated by the microphone 103 is fed to the NMOS and PMOS CG amplifiers 120, 121 as an anti-symmetrical current signal, shown collectively as IOUTP from node 109 and IOUTM to node 106. The IOUTP/IOUTM signals form a differential current output signal which may be sensed, buffered or otherwise amplified in any appropriate manner as known to those skilled in the art. By anti-symmetrical, it is meant that the magnitude of IOUTP current flowing out of node 109 is approximately equal to the IOUTM current flowing into the node 106 and the currents are 180 degrees out of phase relative to each other. In the illustrated embodiment, the current through the current buffer 115 is provided to the inputs of the TIA 110 as a differential current output signal IOUTP/IOUTM. The IOUTP/IOUTM current signal is provided to the inputs of the TIA 110, which produces the differential output voltage VOUTP/VOUTM in response. The differential voltage VOUTP/VOUTM can also be provided to the input of another amplifier stage (not shown) for further amplifying the signal.

The OTA-C filter 113 completes a negative feedback loop circuit that senses any DC offset of the differential signals VOUTP/VOUTM (developed from IOUTP/IOUTM) and accordingly adjusts the currents I1 and I1' of the current sources 101 and 105, respectively, to adjust DC offset back to zero. The OTA 111 generates an adjust current at its output based on the DC offset sensed at VOUTP/VOUTM, where the adjust current is used to charge the capacitor C to develop the DCOA voltage on node 112. The DCOA voltage that develops on the capacitor C adjusts the current sources 101, 105 to adjust the total DC bias current to counteract any DC offset of the VOUTP/VOUTM signal.

The input nodes 102 and 104 are shown using square symbols to depict chip or integrated circuit (IC) pins and the terminals of the microphone 103 are shown with arrows to depict connection points. Although integrated microphones are contemplated, the microphone 103 is conveniently provided as an external component in which the differential microphone preamplifier 100 is integrated onto a separate chip or IC. Thus, the input nodes 102 and 104 are provided externally as IC pins for coupling to the external microphone. The differential current output nodes 109 and 107 may also be provided externally on IC pins although not specifically shown as such. As illustrated, the negative feedback loop circuit, including the differential TIA 110 and the OTA-C filter 113, is also integrated onto the same chip to compensate for DC offset generated by various sources including microphone variations.

In an experimental configuration using the true differential microphone preamplifier 100, the VOUTP/VOUTM output signal displayed a differential waveform when a model floating microphone was connected to the amplifier's input terminals at nodes 102 and 104. The amplifier 100 met or exceeded the noise, distortion and PSR of applicable specifications. In particular, the input referred noise at 1 kilohertz (KHz) was approximately 90 nV/sqrtHz ("sqrt" being square root), the total harmonic distortion with 1 KHz 0.707 Vrms (root mean square) output was approximately 74 decibels (dB), and the PSR ratio at 217 Hz was approximately 87 dB.

It is appreciated that a true differential microphone amplifier implemented according to an embodiment of the present invention provides many benefits. The two terminals of the JFET microphone are connected directly to the amplifier's input without external components, such as bias resistors or coupling capacitors. The microphone is used as a differential current source and neither terminal is grounded. The amplifier output is a true differential current signal so that there is no need for a microphone bias pin, which reduces pin count. The current buffer 115 performs the dual function of biasing the microphone while also extracting the signal current. The weak signal from the microphone (or from other types of signal generating devices) is amplified while common mode noise is rejected because of the true differential configuration. A negative feedback loop circuit may be provided to sense any DC offset and to adjust bias currents accordingly to compensate and minimize the DC offset.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A differential amplifier circuit for amplifying a signal developed by a signal generating device when coupled between first and second input nodes and for providing an amplified differential signal at first and second output nodes, said differential amplifier circuit comprising:
    first and second current sources that source first and second current levels to the first input node and to the first output node, respectively;
    first and second current sinks that sink said first and second current levels from the second input node and the second output node, respectively;
    a first current amplifier that controls current between the first output node and the second input node to maintain the second input node at a first bias voltage level; and
    a second current amplifier that controls current between the first input node and the second output node to maintain the first input node at a second bias voltage level.

2. The differential amplifier circuit of claim 1, wherein said first and second current sources, said first and second current sinks, and said first and second current amplifiers collectively operate to establish a predetermined bias current through, and a predetermined bias voltage across, the signal generating device when coupled between the first and second input nodes.

3. The differential amplifier circuit of claim 1, wherein the signal generating device comprises:
    a junction field-effect transistor (JFET) having a gate; and
    an electret condenser coupled to said gate of said JFET;
    wherein the amplified differential signal between first and second output nodes comprises a current signal.

4. The differential amplifier circuit of claim 1, wherein said second current source, said first current sink and said first current amplifier collectively comprise an N-channel metal-oxide semiconductor (NMOS) common gate amplifier and wherein said first current source, said second current sink and said second current amplifier collectively comprise a P-channel MOS (PMOS) common gate amplifier.

5. The differential amplifier circuit of claim 1, wherein:
    said first current amplifier comprises:
        a first transconductance amplifier having a non-inverting input receiving said first bias voltage level, an inverting input coupling to said first current sink and an output of the first transconductance amplifier; and
        an N-channel metal-oxide semiconductor (NMOS) transistor having a drain coupled to said second current source, a gate coupled to said output of said first transconductance amplifier and a source coupled to said inverting input of the first transconductance amplifier; and
    wherein said second current amplifier comprises:
        a second transconductance amplifier having a non-inverting input receiving said second bias voltage level, an inverting input coupled to said first current source and of the second transconductance amplifier; and
        a P-channel MOS (PMOS) transistor having a drain coupled to said second current sink, a gate coupled to said output of said second transconductance amplifier and a source coupled to the inverting input of said second transconductance amplifier.

6. The differential amplifier circuit of claim 1, further comprising:
    a negative feedback loop circuit having a differential input coupled to said second current source and said second current sink and an output providing an adjust signal indicative of DC offset of the amplified differential signal; and
    wherein said first current source and said first current sink each have an adjust input coupled to said output of said negative feedback loop circuit.

7. The differential amplifier circuit of claim 1, further comprising a differential trans-impedance amplifier having a differential input coupled to said second current source and said second current sink and a differential voltage output.

8. The differential amplifier circuit of claim 7, further comprising:
    an operational transconductance amplifier having a differential input coupled to said differential voltage output of said differential trans-impedance amplifier and having an output;
    a capacitive device coupled to said output of said operational transconductance amplifier; and
    wherein said first current source and said first current sink each have an adjust input coupled to said output of said operational transconductance amplifier.

9. A differential microphone amplifier, comprising:
    a first current source, coupled between a voltage source and a positive microphone node, that provides the first current level;
    a second current source, coupled between a negative microphone node and ground, that provides said first current level;

a third current source, coupled between said voltage source and a positive current output node, that provides the second current level;

a fourth current source, coupled between a negative current output node and ground, that provides said second current level;

a first current amplifier circuit, coupled between said positive microphone node and said negative current output node, that maintains said positive microphone node at a first bias voltage and that develops a first polarity amplified microphone signal at said positive current output node; and a second amplifier circuit, coupled between said positive current output node and said negative microphone node, that maintains said negative microphone node at a second bias voltage and that develops a second polarity amplified microphone signal at said negative current output node;

wherein said first and second bias voltages provide a microphone bias voltage and wherein said first and second current levels provide a microphone bias current.

10. The differential microphone amplifier of claim 9, further comprising a differential trans-impedance amplifier circuit having differential inputs coupled to said positive and negative current output nodes and an output providing a corresponding differential output voltage signal.

11. The differential microphone amplifier of claim 10, further comprising:

said first and second current sources each having an adjust input;

an operational transconductance amplifier (OTA) having a differential input coupled to receive said differential output voltage signal and an output coupled to said adjust inputs of said first and second current sources; and a capacitor coupled to said output of said OTA.

12. The differential microphone amplifier of claim 9, wherein said first and fourth current sources and said first current amplifier circuit collectively comprise a P-channel metal-oxide semiconductor (PMOS) common gate amplifier, and wherein said second and third current sources and said second current amplifier circuit collectively comprise an N-channel MOS (NMOS) common gate amplifier.

13. The differential microphone amplifier of claim 9, wherein said first current amplifier circuit comprises:

a P-channel device having a source coupled to said positive microphone node, a gate, and a drain coupled to said negative current output node; and a transconductance differential amplifier having a non-inverting input receiving a bias voltage, an inverting input coupled to said positive microphone node, and an output coupled to said gate of said P-channel device.

14. The differential microphone amplifier of claim 9, wherein said second amplifier circuit comprises:

an N-channel device having a source coupled to said negative microphone node, a gate, and a drain coupled to said positive current output node; and a transconductance differential amplifier having a non-inverting input receiving a bias voltage, an inverting input coupled to said negative microphone node, and an output coupled to said gate of said N-channel device.

15. A method of amplifying signals from a microphone while rejecting common mode noise, comprising:

sourcing a first current into a first microphone node;

sourcing a second current into a first output node;

pulling the first current from a second microphone node;

pulling the second current from a second output node;

controlling a first current between the first microphone node and the second output node while maintaining voltage at the first microphone node at a first bias voltage level;

controlling a second current between the second microphone node and the first output node while maintaining voltage at the second microphone node at a second bias voltage level; and detecting a differential amplified output current at the first and second output nodes.

16. The method of claim 15, wherein said controlling the first current between the first microphone node and the second output node while maintaining voltage at the first microphone node at a first bias voltage level comprises:

detecting, by a high gain amplifier, the first bias voltage level; and controlling, by the high gain amplifier, a current device coupled between the first microphone node and the second output node in an attempt to maintain the voltage at the first microphone node at the first bias voltage level.

17. The method of claim 15, wherein said controlling the second current between the second microphone node and the first output node while maintaining voltage at the second microphone node at a second bias voltage level comprises:

detecting, by a high gain amplifier, the second bias voltage level; and controlling, by the high gain amplifier, a current device coupled between the second microphone node and the first output node in an attempt to maintain the voltage at the second microphone node at the second bias voltage level.

18. The method of claim 15, further comprising sensing a DC offset of the differential amplified output current and adjusting the first current sourced into a first microphone node and the first current pulled from the second microphone node.

19. The method of claim 15, wherein said detecting a differential amplified output current at said first and second output nodes comprises converting the differential amplified output current into a differential voltage.

20. The method of claim 17, further comprising:

converting the differential voltage into an adjust current;

charging a capacitor with the adjust current to develop an adjust voltage; and adjusting the first current sourced into a first microphone node and the first current that is drawn from the second microphone node based on the adjust voltage.

* * * * *